United States Patent
Lachowicz et al.

(10) Patent No.: US 9,558,952 B2
(45) Date of Patent: Jan. 31, 2017

(54) ALKALINE PICKLING PROCESS (71) Applicant: FRAUNHOFER-GESELLSCHAFT ZUR FÖRDERUNG DER ANGEWANDTEN FORSCHUNG E.V., München (DE)

(72) Inventors: Agata Lachowicz, Karlstein (DE); Berthold Schum, Biebergemünd (DE); Heinrich Blanke, Hünstetten (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 14/420,246

(22) PCT Filed: Aug. 12, 2013

(86) PCT No.: PCT/EP2013/066796
§ 371 (c)(1),
(2) Date: May 8, 2015

(87) PCT Pub. No.: WO2014/023842
PCT Pub. Date: Feb. 13, 2014

(65) Prior Publication Data
US 2015/0243517 A1   Aug. 27, 2015

(30) Foreign Application Priority Data
Aug. 10, 2012 (DE) .......... 10 2012 107 372

(51) Int. Cl.
*H01L 21/302* (2006.01)
*H01L 21/461* (2006.01)
*H01L 21/306* (2006.01)
*H01L 31/0236* (2006.01)
*H01L 31/18* (2006.01)
*C09K 13/02* (2006.01)
*H01L 21/02* (2006.01)

(52) U.S. Cl.
CPC ......... *H01L 21/30608* (2013.01); *C09K 13/02* (2013.01); *H01L 21/02021* (2013.01); *H01L 31/02363* (2013.01); *H01L 31/1804* (2013.01); *Y02E 10/547* (2013.01); *Y02P 70/521* (2015.11)

(58) Field of Classification Search
CPC ................... H01L 21/30608; H01L 21/02021; H01L 31/1804; H01L 31/02363
USPC ............................................ 216/91; 438/747
See application file for complete search history.

(56) References Cited

U.S. PATENT DOCUMENTS

| 2004/0259335 A1 | 12/2004 | Narayanan et al. |
| 2005/0247674 A1 | 11/2005 | Kubelbeck et al. |
| 2008/0233760 A1 | 9/2008 | Delahaye |

(Continued)

FOREIGN PATENT DOCUMENTS

| DE | 102 41 300 A1 | 3/2004 |
| DE | 103 13 127 A1 | 11/2004 |

(Continued)

*Primary Examiner* — Roberts Culbert
(74) *Attorney, Agent, or Firm* — Hudak, Shunk & Farine Co. LPA (57) ABSTRACT

A process for edge isolation or texture smoothing of a substrate, in which a process medium which allows control treatment of limited regions of the substrate is used. The process is therefore particularly suitable for one-sided treatment of substrates. The viscosity of the process medium plays a central role here. Furthermore, an apparatus designed for the process is presented.

12 Claims, 3 Drawing Sheets

(56) References Cited

U.S. PATENT DOCUMENTS

2011/0183524 A1  7/2011  Teppe et al.

FOREIGN PATENT DOCUMENTS

| DE | 10 2005 062 528 A1 | 6/2007 |
| DE | 10 2008 037 404 A1 | 4/2010 |
| DE | 10 2009 050 845 A1 | 4/2011 |
| DE | 10 2011 050 055 A1 | 4/2012 |
| EP | 1 733 418 B1 | 9/2010 |
| WO | 20050734 A1 | 8/2005 |
| WO | 2011 035748 A1 | 3/2011 |

ALKALINE PICKLING PROCESS

FIELD OF THE INVENTION

The invention comprises a method for etching of substrates, in particular for one-sided etching of substrates. An alkaline process medium is provided which allows a one-sided etching process in particular for edge isolation without any additional masking of the side which is not supposed to be etched. In addition, a design of an apparatus is proposed which is adjusted to the course of the reaction and the reaction products and allows a reliable process.

The method according to the present invention can also be used for one-sided etching of crystalline solar cells, in particular for the purpose of edge isolation. But it can also be used for other purposes. The use of this method and of the respective apparatus makes sense in the case, when an etching process should only be applied in a limited manner to certain regions of a substrate.

During the course of the production of crystalline solar cells it has to be guaranteed that regions comprising metal contacts of opposing doping types are separated from each other so that it is possible to use the produced photocurrent. Thus, the regions with different doping are isolated from each other.

In the typical method of gas phase diffusion in a quartz tube the emitter doping is formed on both sides of the wafer. For example, on wafers of the p-type with a basic doping of boron the emitter is formed by diffusing phosphorus with phosphoryl chloride as the source. Typically, the n-doped emitter has a depth of <1 µm, normally 0.3 to 0.6 µm.

On the back side (the side which is the far side from the sun) of the solar cell this n-doping is overcompensated by sintering with aluminum pastes. By doping with aluminum which has a depth of some micrometers, a region with a p-doping which is higher than that of the basic doping of boron is achieved. However, the region doped with aluminum is directly adjacent to the region doped with phosphorus.

After the metallization of the front side has been conducted, without any edge isolation an electrically conductive connection between both sides of the cell would exist—a short circuit. Also in other diffusion methods in which the doping source is one-sidedly applied the formation of a parasitic emitter on the edge and in a small peripheral region on the lower side cannot be prevented without any suitable masking. For cells with passivated back sides the parasitic emitter has to be removed from the whole surface of the back side.

The back side comprises dielectric passivation layers such as silicon oxide, silicon nitride or aluminum oxide and is doped only locally with aluminum for forming the metal contact and the back surface field.

An established method is the laser edge isolation. For the separation of the differently doped regions a circumferential groove near the wafer rim is formed by material removal by means of a laser.

Also known is the plasma edge isolation. In this method the wafers are stacked atop each other and are placed in a plasma reactor. A layer which is sufficiently thick is removed from the wafer edges by the exposure to plasma. A disadvantage of this method is that the removal of material does not exclusively take place at the edges, but also in a minor extent at the surface of the wafers which reduces the active area of the cell. The stacking of the wafers can in addition cause wafer fracture, in particular in the case of wafers which are very thin.

The chemical edge isolation has shown to be particularly advantageous and has been used very often. In this method an acidic etching solution consisting of nitric acid and hydrofluoric acid, optionally with further components, is used. The etching process is conducted on one side with the help of suitable industrial manufacturing equipment, wherein the solution is drawn up also at the edges by capillary forces so that both, the back side and also the edges are etched. For the complete removal of the emitter a layer of 1-2 µm is etched away.

The filling level of the process medium relatively to the transport plane has to be adjusted very exactly for guaranteeing a sufficient etching effect on the lower side and the edges, but for preventing the wetting of the upper side of the wafer, i.e. the emitter side.

Etching away of parts of the emitter and/or nonuniform etching of the emitter (stronger uncontrolled etching which in particular happens at the rim) would result in disadvantages with respect to the mode of operation of the solar cell, and thus necessarily this has to be prevented. When the level of the liquid in the process tank is too high, then this may result in spilling over (in particular at the outlet) or creeping of the etching solution onto the surface.

Creeping is caused by capillary forces, the characteristics thereof are additionally influenced by the condition of the process medium and by the condition of the substrate surface. For reducing the tendency of creeping onto the surface, for example, an etching solution which besides hydrofluoric acid and nitric acid also contains sulfuric acid can be used. With the addition of the sulfuric acid to the etching solution the viscosity is increased which counteracts the capillary forces.

The creeping behavior is influenced very strongly by the texture of the substrate. Isotextured substrates, i.e. substrates with rounded recesses in the surface, which are etched in an acidic isotexture solution being also based on hydrofluoric acid and nitric acid show a lower tendency to creeping than alkali-textured substrates with pyramidal structures on the surface.

Hydrophilic surfaces such as the phosphorus silicate or borosilicate glass produced during the diffusion or the oxidized silicon surfaces encourage creeping. With a hydrophobic surface creeping of the (aqueous) solution is reduced. The hydrophobic surface is produced by treatment in diluted hydrofluoric acid.

Both possibilities have advantages and disadvantages. The hydrophilic glass encourages creeping, but also forms a protective layer for the emitter. At first the glass is attacked by the etching solution. When the glass is removed before the step of edge isolation, then this results in a hydrophobic but unprotected emitter surface which may be attacked not only by the etching solution but also by reactive vapors. In spite of these problems both methods are used in industry in suitable facilities.

BACKGROUND OF THE INVENTION

Two different facilities are for example described in the references DE 10 2005 062 528 A1 and DE 10 313 127 B4. In the last-mentioned reference a method is described in which the lower side of the wafer is contacted with the etching solution, wherein a meniscus is formed. During the whole process time the lower side of the wafer is continuously in contact with the etching solution. In the first-mentioned reference a method is described in which the lower side of the wafer is not continuously in contact with the etching solution. The etching solution is applied onto the lower side of the wafer by a special profile pattern of the rotating transport rolls, wherein the wafer at the same time is horizontally moved on. At the lower side of the wafer a liquid film is formed.

Through the etching reaction inter alia nitrogen oxides ("NOx" gases) are produced which are partially dissolved in the etching solution, but which also partially reach the headspace of the process modules. Nitrogen oxides in connection with vapors of hydrofluoric acid have an etching effect on silicon, in particular on highly doped silicon, such as the emitter, and through the HF portion also on phosphorus silicate glass or borosilicate glass. For avoiding an undesirable (since nonuniform) etching of the emitter side, the reaction vapors are withdrawn by suction from the process compartment and/or additives are added to the process medium for avoiding the formation of gas.

In DE 10 2009 050 845 A1 a method is described in which onto the upper side of the wafer before the one-sided etching process a defined amount of water is applied onto the wafer. The water spreads out across the hydrophilic wafer surface (with phosphorus silicate or borosilicate glass) and thus forms a protection layer against the etching vapors.

In DE 10 2008 037 404 A1 a one-sided etching process is described in which the composition of the gas phase above the process medium is influenced in such a manner that the surface during the process of edge isolation is made hydrophobic and/or after a previous treatment in diluted hydrofluoric acid stays hydrophobic. Only acidic media are described.

It is also possible to use the reaction vapors for an intentional back-etching of the emitter. Such a process is described in WO 2011/035748 A1. In order that the emitter side is etched as homogenously as possible, the reaction vapors are accordingly withdrawn by suction or an inert gas is fed to the gas phase over the process medium in addition or a reactive gas such as HF or ozone is fed in addition. For back-etching of the emitter optionally an additional etching step, preferably with HF and ozone, as solution or in the gas phase, is mentioned for a better adjustability of the process of back-etching. A uniform controlled back-etching of the emitter is desirable, because by the removal of highly doped topmost emitter layers the surface recombination of the produced charge carriers is reduced and thus the efficiency factor of the solar cells is improved. Normally, the edge isolation and the back-etching of the emitter are conducted in two separated process modules with different etching solutions. The etching media which are proposed are acidic.

The NOx/HF vapors have to be aftertreated separately in suitable facilities. Fluoride is precipitated as CaF2 by bubbling through lime milk, the NOx gases are reacted to nitrogen. The etching solution of HNO3/HF is toxic. Therefore, the disposal of spent etching solutions of HNO3/HF is costly.

In all mentioned and industrially used methods an etching solution on the basis of hydrofluoric acid and nitric acid is used.

An alkaline process for the removal of the undesired doped region on the back side is described in US 2004/0259335 A1. Here the front side and the edges are protected by a protection layer/mask of silicon nitride. The etching rate of silicon nitride in an alkaline solution is negligible low. But a disadvantage of alkaline solutions is that the tendency of creeping is still higher than in the case of acidic solutions.

A reliable practicable alkaline method for one-sided etching of a substrate, in particular for edge isolation, without the need of a mask for the protection of the emitter side is not known.

SUMMARY OF THE INVENTION

It is an object of the present invention to provide a reliable method for one-sided etching of substrates, in particular for edge isolation, in which no additional masking of the emitter side is necessary. It should be made possible that for the etching process a nontoxic and nonhazardous process medium can be used which does not form reactive vapors, in particular no NOx gases.

The object is solved by the subject-matter of the patent claims.

According to the present invention is a method for etching a substrate with the step
contacting of the substrate with a process medium which is placed in a process tank, wherein the substrate is transported such that it is moved in a plane which is substantially oriented in a parallel direction to the surface of the process medium.

The process medium has a pH value of higher than 12 and a viscosity of at least 1.5 mPas. The pH value is preferably higher than 13 and particularly preferably higher than 13.5. The viscosity is preferably higher than 1.75 mPas, further preferably higher than 2 mPas and particularly preferably higher than 2.5 mPas. For this purpose the process medium contains at least one alkaline and at least one viscosity-increasing component.

The use of a process medium having a relatively high viscosity prevents creeping of the medium into regions of the substrates to be treated which should not be contacted with the process medium. In the case of semiconductor substrates thus the process medium allows that a reliable process of edge isolation without any deleterious etching of the emitter becomes possible. The method according to the present invention is preferably a process of edge isolation as is conducted in the case of producing solar cells. But the viscosity of the process medium should also not be too high, so that it is capable of wetting the substrate and of being pumped. It was shown that it is favorable not to exceed a viscosity of $10^3$ mPas, preferably $10^2$ mPas, more preferably 10 mPas and particularly preferably 7 mPas. Preferably, the process medium is not a paste.

In many prior art methods the process medium has to be heated for achieving suitable etching rates. According to the present invention this is preferably not necessary.

According to the present invention the viscosity of the process medium is preferably determined with a rotary viscometer (DIN 53019). Unless otherwise stated, all tests are conducted under standard conditions (DIN 1343).

Also an apparatus for conducting the method is part of the present invention. The apparatus comprises modifications which are adjusted to the course of reaction with a process medium being used according to the present invention and thus allow a reliable process.

BRIEF DESCRIPTION OF THE DRAWINGS

Description of the Drawings

FIG. 1 shows an apparatus of prior art. A substrate 1 is moved over a process medium 5 by shafts of support 2 in such a manner that this medium comes in contact with substrate 1. The filling level 11 of the process medium 5 is selected such that a meniscus 10 is formed. Therefore, a respective method is also called meniscus etching. When an acidic process medium which normally contains nitric acid (HNO3) is used, NOx vapors 6 are produced which form a gas atmosphere 7 as a toxic by-product.

DETAILED DESCRIPTION OF THE INVENTION

The process medium has an alkaline pH value for etching the substrate. During etching a part of the substrate is removed from its surface. For adjusting the alkaline pH value, the process medium preferably contains at least one alkaline component. The alkaline pH value of the process medium facilitates processing of the substrate without the formation of any hazardous vapors.

An alkaline process medium has the advantage that no etching vapors are formed and that the solution is not toxic and not hazardous. The only reaction product which is formed is hydrogen, and the gas phase would only contain water vapor in addition. In the case of the use of an alkaline process medium the evolution of gas is higher than in the case of the use of an acidic medium. To deal with this issue, apparatus modifications are made at the apparatus according to the present invention.

Preferably, the concentration of the alkaline component is in the range of at least 0.1% by weight, based on the process medium. Further preferable are at least 0.5% by weight and particularly preferable are at least 3% by weight. When the concentration of the alkaline component exceeds a certain value, then no further increase of the etching rate can be achieved. Therefore, the content of the alkaline component is preferably at most 50% by weight, further preferably at most 25% by weight, based on the process medium. Particularly preferable are at most 15% by weight.

The alkaline component is preferably selected from organic and inorganic bases as well as mixtures thereof. Preferable bases are hydroxides, in particular metal hydroxides, and amino derivatives. Preferable metal hydroxides are alkali metal hydroxides, in particular sodium hydroxide and potassium hydroxide as well as mixtures thereof. Preferable amino derivatives are ammonia, tetraalkylammonium hydroxide and amines as well as mixtures thereof. These alkaline components are further characterized by the advantage that their price is much lower than that of hydrofluoric acid.

The tendency to creeping of the alkaline process media which are used in this invention is higher than in the case of acidic process media, in particular onto textured and doped silicon surfaces. Therefore, according to the present invention preferably at least one viscosity-increasing substance is used in the process medium. The viscosity-increasing substances reduce the tendency of the process medium to creep at sites of the substrate which should not be etched. It must be guaranteed that the viscosity-increasing substances do not modify the etching reaction, in particular do not or do not substantially slow down the etching reaction, so that the required layer removal, normally 1 to 2 µm, could be achieved by etching within industrially practicable process times.

The viscosity-increasing substances may be organic or inorganic substances. Also mixtures of organic and inorganic substances can be used. Preferable viscosity-increasing substances are inorganic salts such as in particular silicates, phosphates and sulfates as well as mixtures thereof.

Further preferable viscosity-increasing substances are polyalcohols, such as in particular ethylene glycol, diethylene glycol, 1,2-propanediol, glycerin, sorbitol and ordinary sugars such as glucose, fructose and their combinations. Thus, preferable viscosity-increasing substances are polyhydric alcohols. In particular ethylene glycol, 1,2-propanediol, glycerol and sorbitol have shown to be particularly effective, even in the case, when the surfaces of the substrates have hydrophilic properties. It was shown that polyalcohols with less than 4, in particular less than 3 hydroxyl groups are particularly advantageous. These polyalcohols have only a negligible influence on the etching process.

Ethylene glycol and 1,2-propanediol do not influence the etching rate of the process medium, also in the case of high concentrations. With glycerin and sorbitol already a reduction of the etching rate which depends on the concentration can be seen, but it is very low and can be controlled very easily.

Many organic long-chain substances have an excellent viscosity-increasing effect, but they strongly inhibit the reaction rate. At moderate process temperatures in the range of e.g. 50 to 60° C. the etching rate is reduced to one-tenth or less in comparison to a solution which contains only an alkaline component. Therefore, such long-chain molecules cannot be used in the method according to the present invention and are preferably not present in the process medium or their proportion in the process medium should be very low, in particular not higher than 5% by weight, further preferably not higher than 1% by weight, more preferably not higher than 0.5% by weight and particularly preferably not higher than 0.1% by weight.

Preferably, the viscosity-increasing substances according to the present invention have high boiling points which are higher than 100° C.

The viscosity-increasing substances are preferably substances with low molecular weight, in particular no polymers. The upper limit of the molecular weight of the viscosity-increasing substances is preferably at most 1,000 g/mol, more preferably at most 500 g/mol and particularly preferably at most 200 g/mol. It was shown that it is possible that additives with higher molecular weight may hamper, i.e. inhibit the etching process very strongly.

Silicates which can be used as a viscosity-increasing component according to the present invention are formed besides hydrogen in the course of the etching reaction of silicon substrates according to the following chemical equation, exemplified with sodium hydroxide as the alkaline component:

$$Si+2NaOH+H_2O \rightarrow Na_2SiO_3+2H_2$$

In order that the increase of the viscosity of the process medium is sufficient for the method according to the present invention, a relatively high concentration of silicate is required, normally at least 50 g/L. For producing this concentration of silicate only through the etching reaction, a high throughput and a respective process management is required. The required concentration of silicate will be achieved in an industrial production process at the earliest after a throughput of ca. 30,000 silicon substrates. This corresponds to the production volume of one day of a common production line for wafers. Therefore, according to the present invention it is necessary that silicate as a viscosity-increasing component is directly added to the process medium at the beginning of the process, when it is used as the viscosity-increasing substance. The high concentration of silicate is then maintained by a respective process management.

In preferable embodiments the process medium consists of water, at least one viscosity-increasing substance, at least one alkaline component and at most 10% by weight, further preferably at most 5% by weight and particularly preferably at most 1% by weight of other ingredients.

It is in fact known to use organic additives for the modification of the course of etching in alkaline solutions. One field of application is the texture of silicon wafers.

Mostly, the texture additives are substances with high molecular weight, and they have a strongly inhibiting effect onto the etching reaction, already in small concentrations in the order of 1 g/L. At the moderate process conditions of the present invention no appreciable and no practicable etching would take place. The process temperature of the texturing process is typically in the range of 80 to 95° C., the time of contact is 10 to 30 minutes. Ca. 10 micrometers of silicon on each wafer side are removed by etching.

The purpose of the texture additives is to moderate and to modify the etching reaction such that the surface of monocrystalline wafers is back-etched in an anisotropic but homogenous manner and that a macroscopically uniform surface structure with desirable pyramid size is formed.

Also additives with smaller molecular size such as ethylene glycol, sorbitol and other polyalcohols (C4-C18) are mentioned. Mostly, these additives are used together with isopropanol, and they are capable of positively influencing the anisotropic etching reaction with respect to the homogeneity of back-etching.

Also organic additives are used as organic moderators in alkaline emitter etching solutions, such as described in DE 10 2011 505 903 A1. Here the inhibiting effect of the additives is used. Only few nanometers are removed from the emitter by etching, the strongly doped topmost layer is removed. At 50° C. and with a contact time of 1 minute a layer with a thickness of less than 3 nm is removed by etching. Solutions with etching rates which are so low are not practicable for the process according to the present invention which requires an etching removal of in particular 1 to 2 μm. Both, the texture as well as the etching of the emitter are generally conducted in an immersion process.

For the method of the present invention it is required that the process medium facilitates high etching rates together with relatively mild conditions.

The concentration of the viscosity-increasing substances is preferably in the range of at least 3% by weight, based on the process medium. Further preferable are at least 5% by weight and particularly preferable are at least 10% by weight. At concentrations which are higher than a distinct concentration of the viscosity-increasing substance the increase of the viscosity would not result in further advantages. Therefore, the content of the viscosity-increasing substance is preferably at most 50% by weight, further preferably at most 35% by weight, particularly preferably at most 25% by weight, based on the process medium. Further preferable are at most 15% by weight.

As an additional component in the process medium preferably at least one oxidant is used for preventing additional roughening of the substrate during the method which may be caused by the alkaline process medium. Suitable are oxidants which do not or not substantially reduce the etching rate of the process medium at the preferable process conditions, at least in certain concentration ranges.

Suitable oxidants are persulfates and hypochlorites. Sodium persulfate is preferably used. Preferable oxidants are peroxodisulfates and peroxomonosulfates. The concentration is preferably in the range of 5 to 35 g/L and in particular up to 20 g/L. At higher concentrations of sodium persulfate the etching rate is reduced strongly. Other oxidants such as hydrogen peroxide or percarbonates inhibit the etching reaction already in very small concentrations, such as 1 g/L. Therefore, they are preferably not used. Preferably, the process medium is an aqueous one, i.e. water is used as a solvent.

With a longer contact time of the substrate and a process medium which also contains an oxidant, i.e. in the case of higher amounts of etching removal such as for example 3 μm, the surface of the substrate is smoothened by the process medium.

A preferable process medium contains the following components in the given proportions:
alkaline component 0.5 to 50% by weight,
viscosity-increasing substance 2 to 50% by weight and
oxidant 0.5 to 10% by weight.

The balance may be a solvent, in particular water, and/or may comprise further alkaline components as well as viscosity-increasing substances.

Preferably, the substrate is a semiconductor substrate, in particular made of silicon, in particular a silicon wafer. The substrate has an upper side and a lower side. The terms "upper side" and "lower side" refer to the orientation of the substrate in the apparatus during the method, wherein preferably the upper side is the front side of a solar cell, respectively its emitter side. The lower side is the side facing the process tank. The upper side is the side facing away from the process tank.

The substrate is preferably contacted with the process medium on one side. "On one side" or "one-sided" means that in the case of a flat substrate, such as a wafer, one of both main sides, thus the front side or the back side, is not contacted with the process medium. "Main sides" are the two sides of the substrate which in comparison to the other sides of the substrate have the largest surface areas.

The used substrate already comprises a texture and can also already comprise an emitter. The method according to the present invention is not a texture method and not an emitter etching method. Preferably, the substrate is a crystalline silicon substrate which is preferably mono-or polycrystalline.

The substrate may comprise a glass layer on the surface due to the emitter doping which is preferably conducted before the step of contacting with the process medium according to the present invention. Preferably, before the step of contacting of the substrate with the process medium this glass is removed, preferably in diluted HF solution, in particular in an immersion process. Thus, before the step of contacting of the substrate with the solution, preferably the substrate is treated with HF solution. The surface of the wafer directly after the treatment with HF is hydrophobic which in addition reduces creeping of the solution.

In preferable embodiments, before the step of contacting with the process medium, the substrate is treated with HF solution only on one side, so that on the other side, in particular the upper side, the protecting glass layer is preserved.

In an alternative, before the step of contacting of the substrate with the process medium a step of back-etching of the emitter may be conducted. For the step of back-etching of the emitter an alkaline solution, such as for example described in DE 10 2011 050 903 A1, can be used, wherein before the glass has to be removed in diluted hydrofluoric acid. Also an acidic HF-containing emitter etching solution, such as for example described in DE 10 2011 050 136 A1, can be used. In this case the dissolution of the glass and the step of back-etching of the emitter can be conducted in one process step.

The apparatus for conducting the method according to the present invention comprises a process tank. During the method the process tank contains the process medium.

Figure 1:
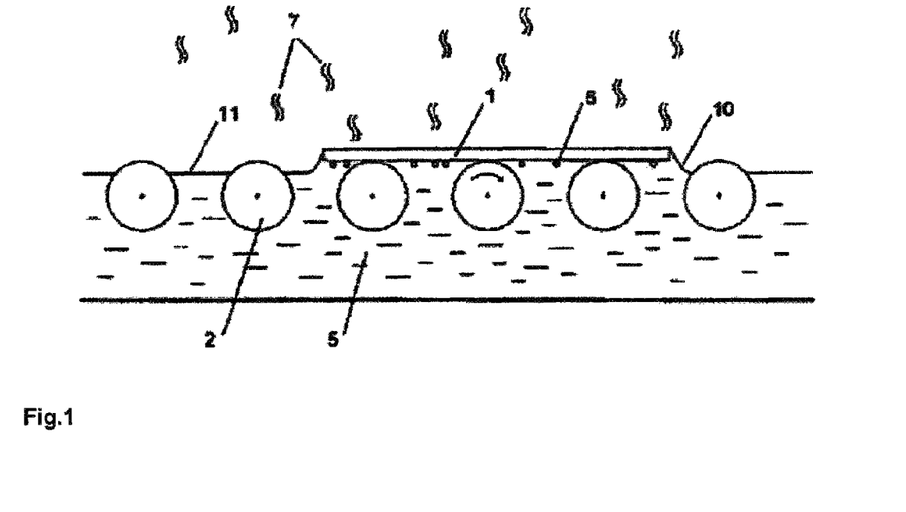
Figure 2:
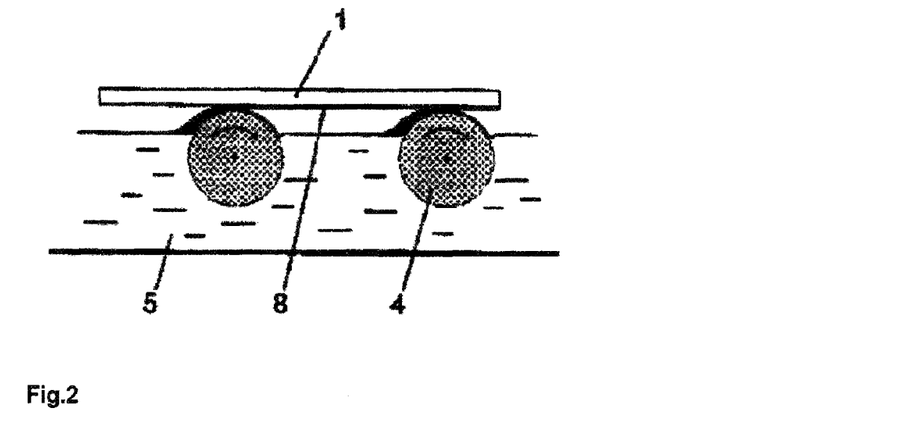
FIG. 2 illustrates the method of film etching which is known from prior art. Between closed massive shafts with profile pattern 4 and a substrate 1 a film 8 of the process medium 5 is formed.

The apparatus preferably comprises at least one means for transporting the substrate during the method. Preferable means of transport are rolls, shafts and rollers, with which the substrate is moved into one transport direction (FIG. 1 shows the principle). Normally, the apparatus comprises several means of transport.

Here the means of transport can be designed in the form of closed massive cylinders, in particular in the form of closed massive shafts being arranged at right angles to the transport direction. During the course of transport the lower side of the substrate over the whole width of the substrate is periodically in contact with the closed massive roll. In an alternative the closed massive roll may have a smooth or preferably a serrated or structured (with profile pattern) surface.

On the other hand, the means of transport may also be designed in the form of a cylinder with a discontinuous cladding. During the course of transport then the lower side of the substrate is periodically in contact with the shaft only at few parts of the width of the substrate (at the so-called points of support). Therefore, the shafts are also called shafts of support.

For film etching closed massive shafts with suitable profile pattern are used. The process solution is transported to the lower side of the substrate only by the profile pattern of the shaft. Gaseous reaction products can directly escape into the process compartment below and above the substrate. By increasing the filling level of the process medium in the process tank also the meniscus etching can be realized with this kind of shafts. In this case periodically the lower side of the substrate on its whole width is contacted with the shafts. Possible gas bubbles adhering at the lower side (produced by the etching reaction) are shoved by the closed massive shaft to the edge of the wafer which lags behind and then they escape into the process compartment, wherein however splashes of the process medium can reach the upper side of adjacent substrates and can impair the emitter.

For meniscus etching normally shafts of support are used. Since the lower side of the substrate is only contacted with the transport shafts at few points of support, the gas bubbles being formed during the course of the etching process are entrained over the whole length of the process tank.

Preferably, during the method the substrate is transported such that it is moved in one plane which is oriented in parallel direction to the surface of the process medium (transport plane). But in a preferable embodiment at the outlet of the process tank the substrate is transported such that the back edge of the substrate is lifted. With the lifting of the back edge of the substrate it can be prevented that the gas bubbles accumulated at the lower side of the substrate burst.

The back edge of the substrate is the portion of the substrate which last leaves the process tank as a result of the transport of the substrate. The outlet of the process tank is the side of the process tank at which the substrate is taken out from the process tank.

Figure 3A:
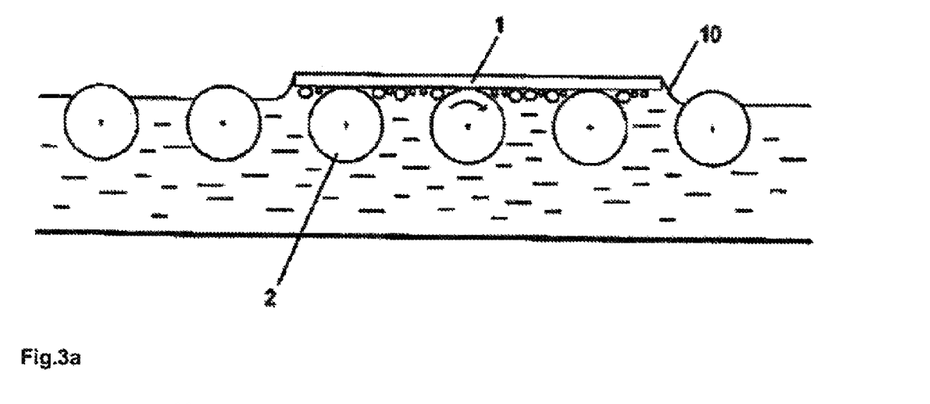
FIG. 3a shows meniscus etching with an alkaline process medium. Meniscus 10 is shown. The substrate 1 is moved by shafts of support 2. Below substrate 1 hydrogen gas bubbles are formed.
Figure 3B:
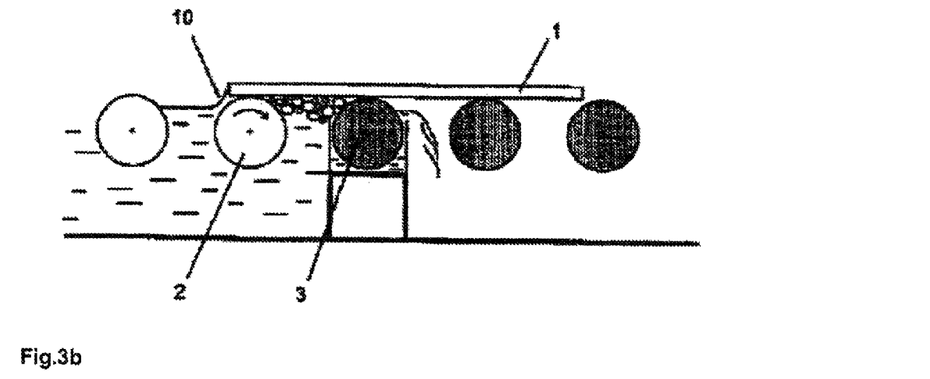
FIG. 3b shows an apparatus with a closed massive shaft 3 at the outlet of the process tank. The substrate 1 is moved by shafts of support 2 and closed massive shafts 3 into the direction of the outlet of the process tank.
Figure 3C:
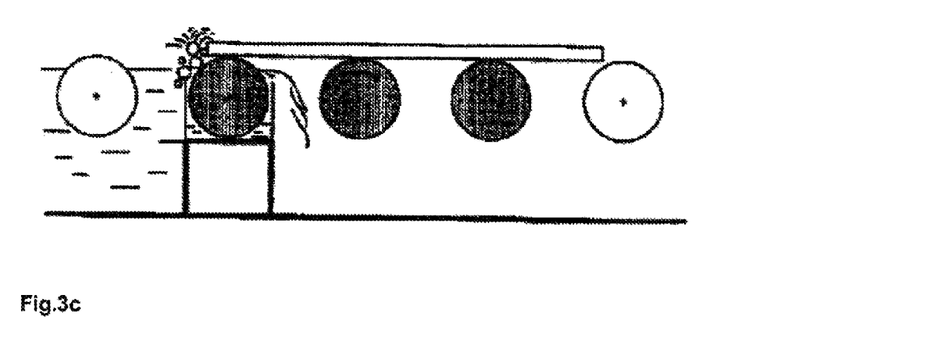
FIG. 3c shows that in the case of the use of an apparatus with a closed massive shaft 3 at the outlet of the process tank there is the risk that through bursting gas bubbles process medium may reach the upper side of the substrate.

In the case of a process tank with closed massive rolls at the inlet and the outlet, the accumulated gas bubbles which may be produced by the reaction of alkaline component with substrate would be shoved at the outlet roll to the back edge and would burst there. Splashes of the process medium would reach the upper side of the substrate and would etch the emitter (see FIGS. 3b and 3c). In a preferable embodiment the means of transport which is nearest to the outlet of the process tank is not a closed massive roll, but preferably a shaft of support.

With the design of the apparatus according to the present invention etching of the upper side of the substrate can be prevented. According to the present invention the means of transport after the process tank are arranged in such a manner that the edge which lags behind respectively the back edge of the substrate is lifted, before this edge passes the last means of transport before the outlet. This for example can be realized by means of transport with smaller diameters, i.e. after the process tank the substrate is allowed "to subside"; or by means of transport which are arranged in a lower position than the means of transport above the process tank (see FIGS. 4a and 4b).

A smaller diameter of the means of transport should be compensated by a respective transmission ratio of the power unit, so that the wafers are transported with constant speed. In an alternative means of transport with the same diameter as in the process tank can be arranged in a lower position. In this case the power unit should also be adjusted.

Figure 5:
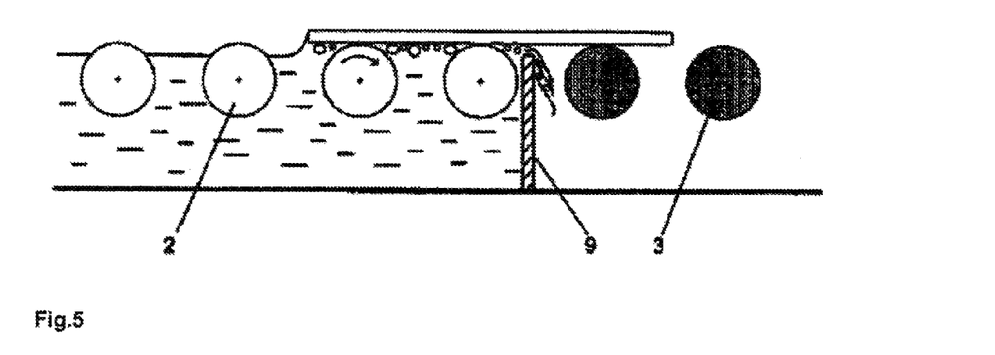
FIG. 5 shows an apparatus with a barrier 9 at the outlet of the process tank. The upper rim of the barrier 9 is arranged lower than the filling level of the process tank. The last shaft of support 2 before barrier 9 is not designed as a closed massive shaft so that the gas bubbles can drain away under the substrate.

In an alternative the closed massive roll at the outlet of the process tank can be replaced by a roll of support. The boundary of the process tank at the outlet is preferably arranged in a lower position than the transport plane of the wafers so that the solution at the edge which is in front drains away and sweeps the gas bubbles away (see FIG. 5).

The water vapor produced in the process compartment should be withdrawn by suctioning in an effective way for preventing a fast oxidation, i.e. increasing the hydrophilicity of the surface. Thus, preferably means for withdrawing the water vapor by suctioning are provided.

The apparatus is preferably designed such that the transport plane is arranged higher than the filling level of the process medium, wherein this difference is at least 0.5 mm and at most 50 mm. But the transport plane may be arranged at the same height than the filling level of the process medium (distance 0 mm). The substrate may also be slightly immersed into the process medium. But it is important that the level of the process medium is not higher than the upper edge of the substrate so that its upper side is not wetted by the process medium. The transport plane is limited on the one hand by the lower side of the substrate and on the other hand by the sites of contact of the substrate with the means of transport. So in the region of the process tank it is oriented substantially in parallel direction to the surface of the process medium.

The process temperature is preferably at least 30° C., further preferably at least 40° C. and particularly preferably at least 50° C. A temperature which is too low compromises the etching rate of the process medium. Nevertheless, the process temperature should not be too high so that an economic process can be realized. Therefore, the process temperature is preferably limited to at most 95° C., further preferably at most 80° C. and particularly preferably at most 70° C.

The contact time of the substrate with the process medium is preferably at least 0.25 minutes, further preferably at least 0.5 minutes and particularly preferably at least 1 minute. The correct contact time results in the desired removal at the substrate. Therefore, the contact time is preferably limited to at most 10 minutes, further preferably at most 7 minutes and particularly preferably at most 5 minutes.

The method is in particularly conducted such that the selection of the process temperature and the contact time results in a removal at the substrate of preferably at least 0.5 µm and further preferably at least 1 µm. But the removal should not exceed a value of preferably 5 µm, further preferably 3 µm and particularly preferably 2 µm.

During the course of the method hydrogen is produced which accumulates at the lower side of the substrate in the form of gas bubbles. In the case that the process medium is in continuous contact with the substrate (meniscus etching with shafts of support) the major part of the gas bubbles adheres at its lower side and they are entrained to the end of the process tank.

Also according to the present invention is the use of the process medium which is described here for edge isolation of substrates which are described here.

EMBODIMENT EXAMPLES

Example 1

Determination of the Etching Rate of Diffused Silicon Wafers in Alkaline Solution with Viscosity-Increasing Substances Monocrystalline substrates of the p-type were textured with alkali and purified. Thereafter on both sides an emitter was formed in a tube diffusion process with POCl3 as doping source. The emitter depth was nearly 0.5 µm. For the removal of phosphorus silicate glass the wafers were treated in diluted hydrofluoric acid so long until the surface has become hydrophobic, and subsequently they were rinsed and dried. The wafers were etched in a laboratory-scale arrangement (in a beaker glass) in solutions with 15 g/L NaOH and the respective additive for 2 minutes each at 55 to 58° C.

TABLE 1 viscosity-increasing substances which can be used in the process according to the present invention.

| Additive | Concentration (mL/L) | Etching rate (µm/min) |
|---|---|---|
| no additive | — | 0.5 |
| soda water glass* | 100 mL/L | 0.38 |
| soda water glass* | 200 mL/L | 0.36 |
| soda water glass* | 300 mL/L | 0.32 |
| ethylene glycol | 100 mL/L | 0.51 |
| ethylene glycol | 250 mL/L | 0.52 |
| ethylene glycol | 500 mL/L | 0.46 |
| diethylene glycol | 100 mL/L | 0.35 |
| diethylene glycol | 200 mL/L | 0.18 |
| glycerol | 100 mL/L | 0.47 |
| glycerol | 250 mL/L | 0.33 |
| sorbitol | 100 g/L | 0.50 |
| sorbitol | 250 g/L | 0.11 |

*soda water glass contains (as a calculated amount) 700 to 750 g/L of sodium silicate Na2SiO3.

Example 2

Determination of the etching rate of diffused silicon wafers in alkaline solution with organic additives with higher molecular weight. These additives can increase the viscosity of the solution, but are not practicable for the process according to the present invention due to the strongly reduced etching rate.

TABLE 2 etching rates of additives with higher molecular weight

| Additive | Concentration (mL/L) | Etching rate (µm/min) |
|---|---|---|
| no additive | — | 0.5 |
| polyethylene glycol 400 | 50 mL/L | 0.07 |
| polyvinylpyrrolidone K30 | 5 g/L | 0.05 |
| hydroxyethylcellulose | 1 g/L | 0.05 |
| polyvinylalcohol | 0.5 g/L | 0.04 |
| sodium dodecyl benzene sulfonate | 1 g/L | 0.05 |

Example 3

Creeping Behavior of a Solution with and without Glycerol as the Viscosity-Increasing Additive Wafer sections after diffusion and HF dip were immersed into an alkaline solution with 15 g/L NaOH respectively into a solution with 15 g/L NaOH and 250 mL/L glycerin up to a height of about 1 cm in vertical direction and were etched for 2 minutes at 55-60° C. After rinsing and drying the etched area can be identified by discoloration and modified surface.

A wafer section which has been immersed into the solution with 15 g/L NaOH was uniformly etched up to the immersion height and it was further nonuniformly etched up to 4 mm above the immersion height by creeping of the solution.

A wafer section which has been immersed into the solution with 15 g/L NaOH and 250 mL/L glycerin was uniformly etched up to the immersion height and only minimally beyond that, less than 1 mm.

Example 4

Monocrystalline wafers with Full Al BSF, KI solution with glycerol
Process—sequence Full Al BSF
1. Alkaline texture
2. Purification
3. Diffusion
4. Etching sequence
  i. Diluted hydrofluoric acid
  ii. Edge isolation
  iii. Emitter etching
  iv. Purification (diluted hydrofluoric acid)
5. Antireflection coating of the front side
6. Screen process metallization
7. Sintering The standard edge isolation with HF/HNO3 solution was conducted in a horizontal facility. The solution according to the present invention was horizontally conducted in a laboratory-scale arrangement in a glass bowl. The wafers were carefully placed on a support apparatus in such a manner that a meniscus to wafer edges was formed and that the lower side of the wafer was in contact with the etching solution.

Process medium: 15 g/L NaOH and 250 mL/L glycerol; contact time 120 s; temperature 55° C.; etching removal: 0.8 μm

TABLE 3 results, measured values of single wafers

| Edge isolation | Removal μm | Contact time s | Voc mV | Jsc mA/cm2 | FF | eta % |
|---|---|---|---|---|---|---|
| NaOH + glycerol | 0.8 | 120 | 0.626 | 37.36 | 0.797 | 18.65 |
| NaOH + glycerol | 0.8 | 120 | 0.626 | 37.50 | 0.799 | 18.75 |
| HF/HNO3 | 2 | 100 | 0.626 | 37.38 | 0.797 | 18.66 |
| HF/HNO3 | 2 | 100 | 0.625 | 37.33 | 0.798 | 18.64 |

Example 5

Production of cells with the edge isolation process according to the present invention, type meniscus etching, in comparison to the edge isolation according to prior art with an etching solution on the basis of HF/HNO3; monocrystalline cells of the p-type with aluminum—Back Surface Field.
Process—sequence Full Al BSF
  a. Alkaline texture
  b. Purification
  c. Diffusion
  d. Etching sequence
    i. Diluted hydrofluoric acid
    ii. Edge isolation
    iii. Emitter etching
    iv. Purification (normally diluted hydrofluoric acid)
  e. Antireflection coating of the front side
  f. Screen process metallization
  g. Sintering
Test Group 1 (Comparative Example):
The edge isolation was conducted by means of film etching with a process medium of nitric acid and hydrofluoric acid. The edge isolation was conducted with phosphorus silicate glass, i.e. process step d.i. was conducted after process step d.ii. Other processes were unchanged and were the same as in test group 2.

Figure 4A:
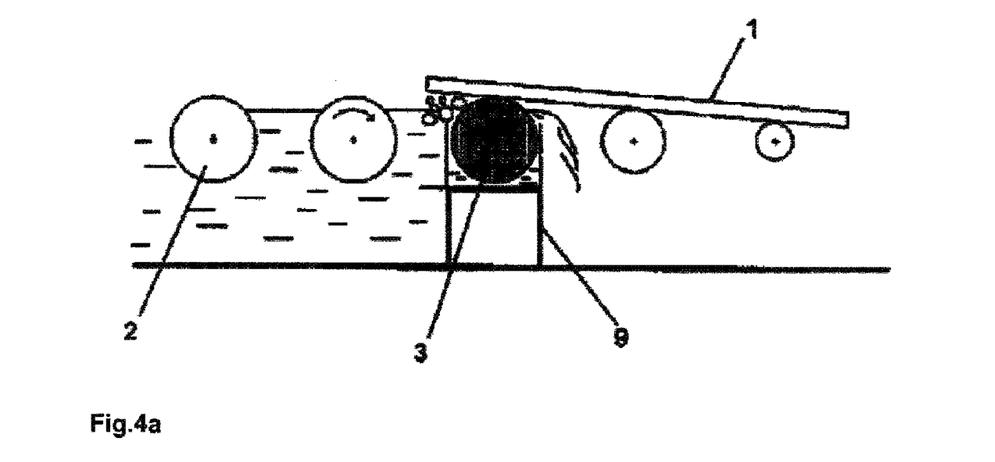
FIG. 4a shows an apparatus according to the present invention with shafts of transport which are placed outside of the process tank. In addition a barrier 9 is shown the upper edge of which is arranged in a lower position than the filling level of the process tank. The shafts of transport outside the process tank have a smaller diameter than the shafts of support 2 and the closed massive roll 3, their axes of rotation are arranged at the same height as that of the shafts of support 2 and the closed massive shaft 3. So the substrate 1 at the outlet of the process tank is lifted at the back edge. Thus, the risk of a contamination of the upper side of the substrate through bursting gas bubbles is prevented.
Figure 4B:
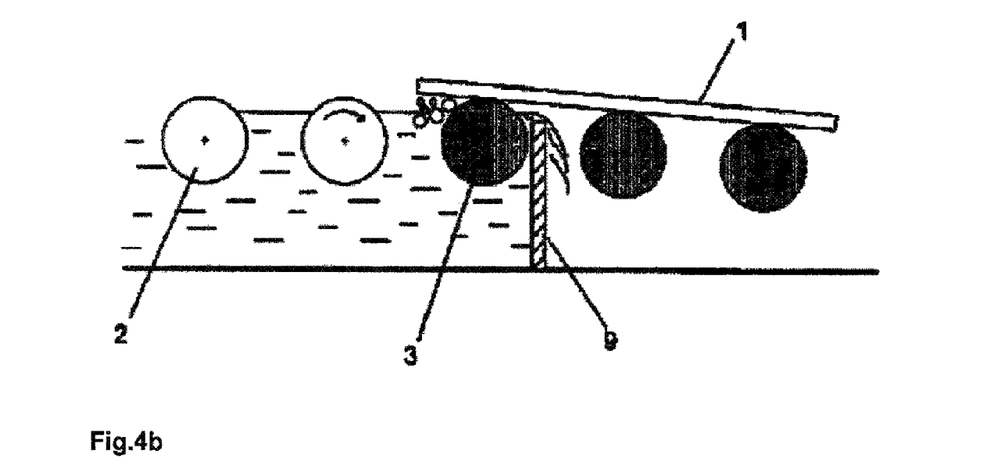
FIG. 4b shows a similar principle with the difference that the shafts of transport outside the process tank have indeed nearly the same diameter as the shafts of support 2 and the closed massive shaft 3, but their axes of rotation are arranged in a lower position than that of the shafts of support 2 and that of the closed massive shaft 3.

Throughput speed 1.2 m/min; contact time 100 s; temperature 20° C.; etching removal: 2 μm
Test Group 2:
The edge isolation was conducted as a one-sided alkaline process in a horizontal facility, after removal of phosphorus silicate glass from the diffusion in diluted HF. The process tank has been configured for meniscus etching, i.e. for the transport of the wafers shafts of support were used, the level of the liquid was adjusted to few millimeters below the plane of the wafer transport. At the inlet and at the outlet of the process tank closed massive rolls with profile pattern were used. After the process tank shafts of transport with decreasing diameter were used so that the wafer edge which lags behind is lifted at the outlet. The process tank arrangement is shown in FIG. 4a.

Process medium: 30 g/L NaOH and 85 mL/L soda water glass; throughput speed 0.5 m/min; contact time 200 s; temperature 58° C.; etching removal: 0.7 μm

TABLE 4 results, mean values of 4 to 5 cells each.

| Group | Removal μm | $R_{sheet}$ ohm/square | Voc mV | Jsc mA/cm2 | FF | Eta % | I02Lf μA |
|---|---|---|---|---|---|---|---|
| 1 | 2.0 | 70 | 0.634 | 37.39 | 0.783 | 18.56 | 9 |
| 2 | 0.7 | 65 | 0.633 | 37.32 | 0.789 | 18.64 | 6 |

Example 6

Production of PERC Cells with Alkaline Edge Isolation, Glass Removal on Both Sides or on One Side
Process—Sequence for Cells with Passivated Back Side (Passivated Emitter and Rear Cells)
  a. Alkaline texture
  b. Smoothing of back side by etching (optional)
  c. Purification
  d. Diffusion
  e. Etching sequence
    i. Dilution hydrofluoric acid
    ii. Edge isolation
    iii. Emitter etching
    iv. Purification (mostly diluted hydrofluoric acid)
  f. Deposition of dielectric passivating layers onto the back side such as silicon oxide, aluminum oxide, silicon nitride
  g. Antireflection coating of the front side (also before process step f., when possible)
  h. Screen process metallization
  i. Sintering Starting material: monocrystalline wafers, doped with boron, specific resistance 4.1 ohm cm. The wafers were processed according to the PERC sequence. Process step b. was omitted.
Test Group 1
Reference Group; Edge Isolation According to Prior Art
The edge isolation was conducted by means of film etching with a process medium of nitric acid and hydrofluoric acid. The edge isolation was conducted with phosphorus silicate glass, i.e. process step e.i. was conducted after process step e.ii. Other processes were unchanged and were the same as in test groups 2 and 3.

Test Group 2

The edge isolation was conducted as a one-sided alkaline process in a horizontal facility. Before the phosphorus silicate glass from the diffusion was removed in diluted HF in an immersion process. The process tank has been configured for film etching, i.e. for the transport of the wafers closed massive shafts with profile pattern were used, the level of the liquid was adjusted to ca. 15 millimeters below the plane of the wafer transport. At the inlet and at the outlet of the process tank also suitable closed massive rolls with profile pattern were used.

Process medium: 50 g/L NaOH and 85 mL/L soda water glass and 5 g/L sodium peroxodisulfate; throughput speed 0.5 m/min; contact time 100 s; temperature 60° C.; etching removal: 1.3 µm Test Group 3

The process sequence was slightly changed. Process step e.i. was conducted only on one side. After the alkaline edge isolation the wafers were aftertreated in diluted hydrofluoric acid in the immersion process.

e. Modified etching sequence
i. Diluted hydrofluoric acid on one side (on the back side)
ii. Edge isolation and subsequently diluted hydrofluoric acid in the immersion process (on both sides)
iii. Emitter etching
iv. Purification (diluted hydrofluoric acid)

Process medium: 50 g/L NaOH and 85 mL/L soda water glass and 5 g/L sodium peroxodisulfate; throughput speed 0.5 m/min; contact time 150 s; temperature 60° C.; etching removal: 1.3 µm

TABLE 5 results, mean values of 4 to 5 cells each.

| Group | Removal µm | Contact time s | Voc mV | Jsc mA/cm2 | FF | Eta % |
|---|---|---|---|---|---|---|
| 1 | 2.0 | 100 | 0.644 | 38.93 | 0.772 | 19.27 |
| 2 | 1.2 | 150 | 0.643 | 38.81 | 0.772 | 19.24 |
| 3 | 1.3 | 150 | 0.642 | 38.86 | 0.771 | 19.26 |

Example 7

Production of PERC Cells with Alkaline Edge Isolation, with Different Etching Removals and Different NaOH Concentrations.

Process—sequence for cells with passivated back side (passivated emitter and rear cells)
a. Alkaline texture
b. Smoothing of back side by etching (optional)
c. Purification
d. Diffusion
e. Etching sequence
  i. Diluted hydrofluoric acid
  ii. Edge isolation
  iii. Emitter etching
  iv. Purification (mostly diluted hydrofluoric acid)
f. Deposition of dielectric passivating layers onto the back side such as silicon oxide, aluminum oxide, silicon nitride
g. Antireflection coating of the front side (also before process step f., when possible)
h. Screen process metallization
i. Sintering

TABLE 6 measured values, mean values of 5-6 cells

| Edge isolation | NaOH g/L | NWG* ML/L | Sodium peroxodisulfate g/L | Removal µm | Voc mV | Jsc mA/cm2 | FF | Eta % |
|---|---|---|---|---|---|---|---|---|
| Standard | HF/HNO₃ | — | — | 2.0 | 0.641 | 38.55 | 0.784 | 19.37 |
| Alkaline | 50 | 80 | 15 | 1.0 | 0.642 | 38.66 | 0.779 | 19.33 |
| Alkaline | 50 | 80 | 15 | 3.1 | 0.642 | 38.73 | 0.779 | 19.39 |
| Alkaline | 100 | 80 | 15 | 1.6 | 0.641 | 38.63 | 0.783 | 19.39 |

*soda water glass contains (as a calculated amount) 700 to 750 g/L of sodium silicate Na2SiO3

Example 8

TABLE 7

Measurement of the viscosity

| Measurement | NaOH g/L | NWG* mL/L | Glycerol mL/L | T ° C. | η mPas * s |
|---|---|---|---|---|---|
| 1 | 0 | 0 | 0 | 20 | 1.002 |
| 2 | 50 | 0 | 0 | 20 | 1.48 |
| 3 | 50 | 100 | 0 | 20 | 1.82 |
| 4 | 100 | 0 | 0 | 20 | 2.22 |
| 5 | 100 | 100 | 0 | 20 | 3.02 |
| 6 | 50 | 50 | 100 | 20 | 2.53 |
| 7 | 50 | 50 | 200 | 20 | 3.78 |

*soda water glass contains (as a calculated amount) 700 to 750 g/L of sodium silicate Na2SiO3

The measurement was conducted with the viscometer of the company Anton Paar, type Physica MCR 101. Cone type used: CP60-0.5.

Example 9

TABLE 8

Measurement of the reflection as an indication for the smoothing of the back side

| Edge isolation | NaOH g/L | NWG* mL/L | Sodium peroxodisulfate g/L | T °C. | t s | Removal μm | Reflection % |
|---|---|---|---|---|---|---|---|
| — | directly after diffusion | | | — | — | — | 10.5 |
| NF/HNO$_3$ | reference | | | 20 | 80 | 2.0 | 25.5 |
| NaOH | 50 | 80 | 10 | 60 | 100 | 1.6 | 31.3 |
| NaOH | 50 | 80 | 10 | 60 | 300 | 3.0 | 33.1 |
| NaOH | 50 | 80 | 15 | 60 | 100 | 1.0 | 29.4 |
| NaOH | 50 | 80 | 15 | 60 | 300 | 3.1 | 33.2 |
| NaOH | 100 | 80 | 15 | 60 | 100 | 1.6 | 32.5 |

*soda water glass contains (as a calculated amount) 700 to 750 g/L of sodium silicate Na2SiO3

LIST OF REFERENCE SIGNS

1 substrate
2 shaft of support
3 closed massive shaft
4 closed massive shaft with profile pattern
5 process medium
6 gas bubbles
7 gas atmosphere
8 film
9 barrier
10 meniscus
11 filling level of the process medium

What is claimed is:

1. A method for etching a semiconductor substrate comprising the step of:
   contacting the substrate with a process medium which is provided in a process tank, wherein the substrate is transported such that it is moved in a plane which is oriented substantially in parallel direction to the surface of the process medium, and
   wherein the process medium comprises at least one alkaline and at least one viscosity-increasing component and has a pH value of higher than 12 and a viscosity of at least 1.5 mPas, and in that the substrate is contacted with the process medium only on one side, wherein "on one side" means that in the case of a flat substrate, such as a wafer, one of both main sides, thus the front side or the back side, is not contacted with the process medium.

2. The method according to claim 1, wherein the process medium comprises the viscosity-increasing component in a proportion of at least 3% by weight.

3. The method according to claim 1, wherein the process medium comprises at least one oxidant, in particular selected from peroxodisulfates or peroxomonosulfates.

4. The method according to claim 1, wherein before the step of contacting the substrate with the process medium, including conducting a step of emitter etching.

5. The method according to claim 1, wherein the viscosity-increasing component comprises polyhydric alcohols, inorganic salts, and mixtures thereof.

6. The method according to claim 5, wherein the viscosity-increasing component comprises silicates, phosphates, or sulfates, or mixtures thereof.

7. The method according to claim 1, wherein the alkaline component is used in the process medium in a proportion of 0.1 to 15% by weight.

8. The method according to claim 1, wherein the substrate before the step of contacting with the process medium is treated with diluted hydrofluoric acid for removing glass or oxides on the surface of the substrate.

9. The method according to claim 1, wherein the process medium is provided in a process tank, the substrate is moved relatively to the process tank and the back edge of the substrate is lifted at an outlet of the process tank.

10. The method according to claim 1, wherein the viscosity of the process medium is higher than 1.75 mPas.

11. The method according to claim 1, wherein the viscosity of the process medium is not higher than $10^3$ mPas.

12. The method according to claim 1, wherein the alkaline component is selected from organic and inorganic bases.

* * * * *